United States Patent [19]

Feuersanger et al.

[11] 4,041,447
[45] Aug. 9, 1977

[54] BONDED MAGNETIC BUBBLE MEMORY

[75] Inventors: Alfred E. Feuersanger, Framingham; Brian A. Shortt, Weston, both of Mass.

[73] Assignee: GTE Laboratories Incorporated, Waltham, Mass.

[21] Appl. No.: 693,069

[22] Filed: June 4, 1976

Related U.S. Application Data

[63] Continuation of Ser. No. 520,583, Nov. 4, 1974, abandoned.

[51] Int. Cl.² ............................................. G11C 19/08
[52] U.S. Cl. ................................. 340/174 TF; 29/626
[58] Field of Search ................... 340/174 TF; 29/684, 29/626

[56] References Cited
PUBLICATIONS

IEEE Transactions on Magnetics, Sept., 1972, pp. 454–457.

*Primary Examiner*—James W. Moffitt
*Attorney, Agent, or Firm*—Irving M. Kriegsman; Leslie J. Hart

[57] ABSTRACT

A bonded bubble memory device includes a non-magnetic first substrate, a thin film layer of magnetic material located on a planar surface of the first substrate, the layer being adapted to sustain cylindrical wall magnetic domains, a second substrate made of a non-magnetic and non-conductive material, a desired pattern of magnetic elements and electrically conductive elements deposited on a planar surface of the second substrate, the pattern including at least three spaced points, the heights of which are equal and predetermined, the thin film layer on the first substrate being in contact with the spaced points on the second substrate so that a controlled spacing is maintained between the thin film layer and the pattern of magnetic elements. A cement composition is applied to portions of the space between the substrates to hold the substrates in a juxtaposed orientation. Advantageous methods of producing the device are also described.

2 Claims, 3 Drawing Figures

BONDED MAGNETIC BUBBLE MEMORY

This is a continuation, of application Ser. No. 520,583 filed Nov. 4, 1974 now abandoned.

BACKGROUND OF THE INVENTION

The present invention relates to cylindrical wall magnetic domain memories and, more specifically, to a bonded bubble memory device and to a method of producing the device.

Magnetic bubble domains constitute a type of domain characteristic of thin film magnetic materials which possess a uniaxial magnetic anisotropy, the easy direction of magnetization being perpendicular to the plane of the film. In a typical bubble memory device, a solid solution of a ferrimagnetic iron garnet is epitaxially grown on a substrate made of a single crystal, and a non-magnetic garnet material. To create the bubbles in the magnetic thin film, a DC magnetic field of a predetermined value is applied perpendicular to the plane of the film. The bubbles are mobile within the magnetic thin film, and the mobility is controlled through the combined effect of an in-plane, rotating magnetic field and a desired pattern of soft magnetic elements located near the plane of the film. These magnetic elements are often combined with conductive elements to form various known circuits, such as the domain detector, transfer switch, generator and annihilator.

In the conventional bubble memory device and method of fabricating the device, the pattern of magnetic elements and conductive elements is deposited on the domain sustaining film. Usually, however, an appropriate oxide coating is first formed on this film to provide a spacer layer between the film and the pattern of elements. The result is a multilayer thin film structure on a single substrate, the structure comprising the bubble film, the oxide coating, the magnetic elements and the conductive elements.

There are several inherent problems with a bubble memory device fabricated as just described. A multilayer thin film structure has a low yield, since a defect generated in any particular layer, usually prohibits the salvaging of the preceeding layers. For example, in the formation of the oxide layer, the garnet crystal is usually heated to about 450° C, and this heat may cause annealing in the crystal, magnetic thin film layer which in turn may create a shift in the magnetic properties of the layer. Furthermore, the pattern magnetic elements and conductive elements can not be prescreened for defects and performance.

SUMMARY OF THE INVENTION

According to the present invention, a bubble memory device and a method of fabricating the device are provided in which the problems previously referred to have been overcome. More specifically, the bubble memory device includes a first and second substrate, the first bearing the single crystal, magnetic thin film layer, the second bearing the pattern of magnetic elements and conductive elements. The substrates are then juxtaposed so that the magnetic layer and the pattern of elements are adjacent to each other. Controlled spacing between the substrates is provided by a plurality of at least three spaced non-colinear points which are formed as part of the pattern of elements, the points having heights, measured from the surface of the second substrate, which are equal and predetermined. The substrates are then secured together. Preferably, a quantity of a cement composition is applied to portions of the space between the substrates to secure the substrates together. The cement composition may completely fill the space between the substrates. Alternatively, the composition may be located along the peripheral edges of the substrates and within the peripheral regions between the juxtaposed substrates. In this manner, the substrates are accurately positioned with respect to each other before the cement composition is applied.

The pattern of magnetic elements and conductive elements have regions in which a conductive element is deposited over a magnetic element, such as in the detector, transfer switch, generator and annihilator circuits. This overlay of elements comprises a spaced point since it is the highest point on the second substrate. Where the circuits are widely distributed throughout the surface area of the pattern, the circuits comprise the plurality of spaced points. Alternatively, spaced points may be separately formed around the periphery of the pattern solely for providing positional stability.

The method of fabricating the device includes forming a layer of a thin film magnetic material on a planar surface of a first substrate which is made of a non-magnetic material and forming a desired pattern of magnetic elements and conductive elements on a planar surface of a second substrate made of a non-magnetic material. The forming of the pattern also includes forming a plurality of at least three spaced, noncolinear points, the heights of which are equal and predetermined. Then the substrates are bonded in a juxtaposed orientation, the spaced points being in contact with the magnetic, thin film layer. The bonding step may be either compression bonding or seam bonding. In seam bonding, the substrates are held together in a properly aligned orientation, and then the cement composition is placed along the edges of the substrates and periphery of the space between the juxtaposed substrates. In compression bonding, the cement composition is applied to the pattern of elements, including the spaced points, and then the substrates are forced together. The cement composition should be of the type which rapidly sets, have a softening temperature in excess of 100° C and have adequate strength to resist moderate stress. There are several preferred methods of applying the cement in either the seam or compression bonding method. In one method, a quantity of a solid cement composition is placed on a bonding surface and composition and surface are heated to the softening temperature of the composition. The juxtaposed substrates are then cooled until the bond is complete. Alternatively, the cement composition may be dissolved in a suitable solvent, and then the resulting liquid bonding solution is applied to the bonding surface. Lastly, the bonding surface may be heated to drive off the solvent after the solution is applied.

There are several advantages and features in the device and method according to the present invention. The device has no oxide spacing layer, thereby eliminating such fabrication step and the adverse effect which heat may impart to the magnetic thin film layer. The integrity of the bubble domain crystal and the pattern of elements may be checked independently of each other, because the layer and the elements are formed on separate substrates. Thus, the yield is enhanced over conventional fabrication techniques. It is important to control the spacing between the bubble layer and the pattern of elements on the second substrate. In conventional devices, control was obtained by forming a uniform layer of an oxide on the magnetic thin film layer and by forming the pattern of elements on the oxide layer. In the present invention, controlled spacing is provided by forming at least three spaced non-colinear points of equal and predetermined height on the second substrate.

DESCRIPTION OF THE PREFERRED EMBODIMENTS

Figure 1:
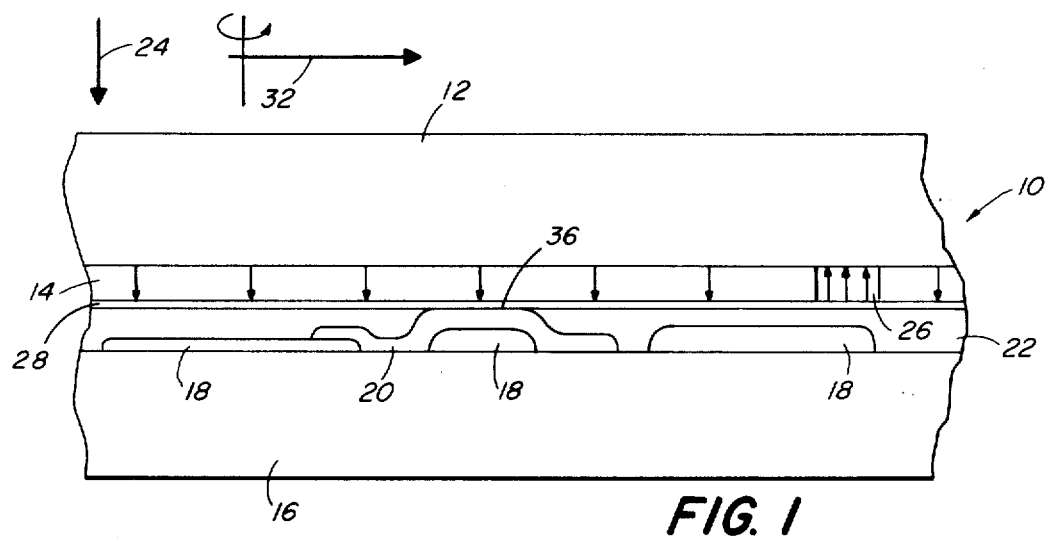
FIG. 1 is a side elevational view of a bonded magnetic bubble memory device according to the present invention.

In an exemplary embodiment of the present invention, as shown in FIG. 1, a bonded magnetic bubble memory device represented generally by the reference numeral 10, includes generally a first substrate 12, a thin film layer 14 on the surface of substrate 12, a second substrate 16, a pattern of elements 18 and 20 on the substrate 16 and a quantity of a cement composition 22. The first substrate 12 comprises a single crystal, non-magnetic material having a planar surface, such as a non-magnetic garnet crystal. The layer 14 includes a thin film, single crystal layer of a magnetic material which under the influence of a DC magnetic field 24 has formed therein a cylindrical wall domain or a bubble 26. Preferably, the layer 14 is an epitaxially grown layer of a ferri-magnetic garnet. If desirable, a thin layer 28 of an ion implanted garnet may be provided. The layer 28 forms a lid to eliminate hard bubbles. An implantation can be used to provide this lid by producing a thin layer of garnet near the exposed surface of the layer 14 in which the easy axis of magnetization is parallel to the surface, not perpendicular as in the bubble supporting layer 14. The details regarding the ion implanted layer may be found in the publication, "Suppression of Hard Bubbles in Magnetic Garnet Films by Ion Implantation", R. Wolfe and J. C. North, Bell System Techn. J. 51, 1436 (1972). In FIG. 1, the implantation is of H2+ ions at 60 KEV 1 × $10^{16}$ ions/cm$^2$. The crystals or layer 14 are LPE grown garnet wafers with a nominal composition of $Y_{1.08}$ $Gd_{0.72}$, $Tm_{1.2}$, $Ga_{0.8}$, $Fe_{4.2}$ and $O_{12}$ or $Y_{2.60}$, $Sm_{0.4}$, $Fe_{3.8}$, $Ga_{1.2}$ and $O_{12}$.

The substrate 16 is a non-conductive and non-magnetic material, such as glass, $SiO_2$, $Al_2O_3$ or passivated Si. Preferably, the substrate 16 is 7059 glass.

The desired pattern of magnetic elements 18 and conductive elements 20 is intended to include one or more of the conventional circuits which propagate, detect, generate, switch and annihilate magnetic bubbles. The propagation circuit comprises only an arrangement of magnetic elements, such as a Y bar pattern 30 of permalloy in FIG. 2. The other circuits include an arrangement of both magnetic elements and electrically conductive elements. All the circuits operate in response to an in plane rotating magnetic field 32. The magnetic elements may include any thin film magnetic material having a high permeability and a relatively low coercivity, such as permalloy. As is well known in the art, permalloy is a high permeability nickel-iron magnetic alloy; preferably the magnetic elements 18 are "81 permalloy" (81% nickel and 19% iron). The conductive elements 20 may include any conductive metal which may be deposited as a thin film by techniques, such as sputtering or electroplating; aluminum, gold and chromium have been found to be particularly useful metals, and preferably the element 20 is gold. The magnetic elements 18 typically may range in thickness from 2500A to 7000A. The conductive elements 20 may typically range in thickness from 4000A to 10,000A.

According to the present invention, the combined thickness of the middle magnetic element 18 in FIG. 1 and the conductive element 20 constitutes the height of a spaced point, represented generally by the reference numeral 36, upon which the layer 14 is juxtaposed, thereby forming the bubble memory device 10. At least two other spaced points (not shown) having heights equal to the point 36 are provided for controlled spacing between the substrates. In FIG. 1, the points are not only formed for the purpose of providing spacing, since they also form a part of the operative pattern of magnetic elements and conductive elements. By spaced points, it is meant that the points are distributed about the surface of the second substrate. These points are non-colinear. The height of the spaced points 36 ranges from 6500A to 17,000A.

Figure 2:
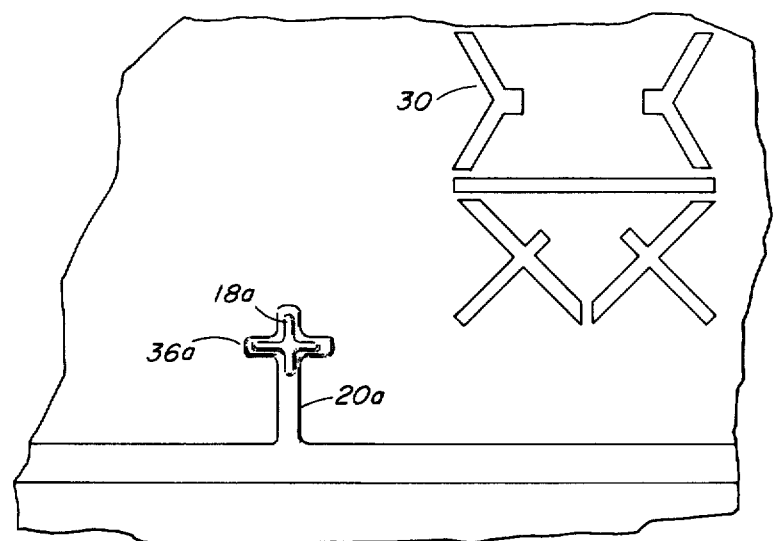
FIG. 2 is a partial plan view of an overlay pattern of magnetic elements and conductive elements, the view illustrating a spaced point according to the present invention.

FIG. 2 illustrates an alternative form of the invention in which a point 36a is formed near the periphery of the substrate 16 solely for the purpose of supporting the garnet 14. FIG. 2 also shows a portion of a bubble propagation track 30. The point 36a is formed by first depositing the layer 18a of a magnetic element (shown as cross-shaped pattern) and then depositing the conductive element 20a over the element 18a. Thus, the spaced point 36a is not an operative part of the bubble circuit, but it is formed on the substrate 16 simultaneously with the formation of the desired circuit pattern. Suitable means are provided for holding the juxtaposed substrates together; preferably, the substrates are bonded together with a cement composition 22. In FIG. 1, the cement composition fills the space between the substrates.

Figure 3:
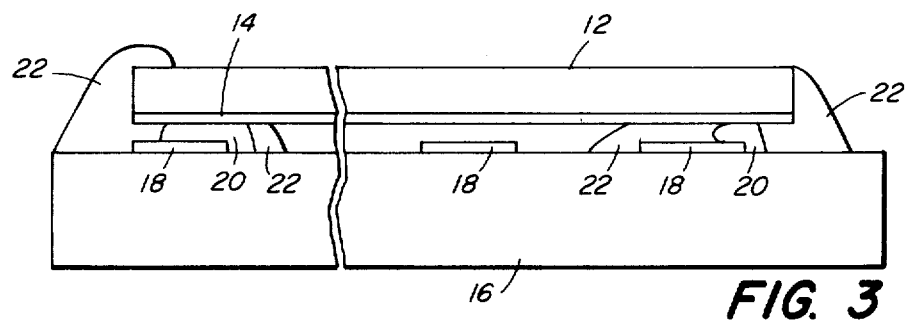
FIG. 3 is a side elevational view of another embodiment of the present invention.

Referring now to FIG. 3, the cement composition is applied along the periphery of the substrates. Some of the cement 22 flows into the region between the substrates. The cement 22 may adhere only to the side of the substrate 12 such as at the right side of FIG. 3 or it may be also deposited on the peripheral upper surface of the substrate 12, as shown on the left side of FIG. 3.

The following description relates to the method of producing the bubble memory device of the present invention. A typical bubble memory device, assembled according to this method, comprises 28 1.1 kilobit shift registers which operate in a single field module, each at a rate of 66Kb/s and in a temperature range from 50° to 70° C. Each shift register is a field accessed shift register with a 28μm period Y-bar permalloy track of 3μm line width prepared on 7059 glass. The interaction components are a seed-conductor loop generator, conductor loop annihilator switch and a matched pair of Y-bar longitudinal stretch detectors.

The method includes the following steps. First, the first substrate 12 is formed of a non-magnetic material having a planar surface. Then, a thin film layer 14 of a single crystal magnetic material is formed on the planar surface of the substrate 12. Preferably, the substrate 12 and the layer 14 are LPE grown garnet wafers, and the fabrication of these wafers is well known to those skilled in the art. The second substrate 16 is then formed of a non-conductive and non-magnetic material having a planar surface. A desired pattern of thin film magnetic elements and conductive elements is formed on the planar surface of the second substrate. Typically, a layer of permalloy is sputtered onto the entire planar surface of the substrate 16. A photoresist is then placed on the permalloy. Then, a photomask of the desired pattern of magnetic elements is placed over the photoresist. Light is directed onto the emulsion except where the masking takes place. The light exposed photoresist is then removed, and the entire substrate is immersed in an etching solution in which all but the desired pattern of permalloy is removed. The pattern of conductive elements is formed similarly by sputtering a layer over the surface of the substrate and the permalloy elements. Removal of excess conductive material is done similarly as with removal of excess permalloy. The result is portions on the surface of the substrate which include a layer of a conductive element over a layer of a magnetic element. These portions must number at least three and be non-colinear. Before bonding the substrates together, the completed substrates are prescreened for their acceptability in operating memory devices. Prescreening of the circuits formed by the pattern of magnetic and conductive elements includes high resolution microscopic inspection and low frequency rotating magnetic field measurements of the detector circuit output as rotating field amplitude. Before prescreening of the domain film layer 14 on the substrate 12, the surface of the layer 14 is implanted with ions, and then the substrate is diced. Prescreening includes scanning the crystal for major magnetic defects in a polarizing microscope equipped with a modulated bias field for defect decoration. The range and uniformity of the bubble collapse field are also measured for each chip; minor defects are also detected by observation of bubble-defect interactions. The crystals and circuits which successfully meet acceptance criteria of these measurements are the only ones used in the memory device. Then, the crystals and the circuit pattern are precleaned carefully so that a uniform, closely spaced bond is obtained.

The substrates are bonded together such that the surface of the crystal layer 14 is in contact with the spaced points of the pattern of elements on the second substrate. As used herein, the word bonding includes either holding the surfaces of the substrate to be bonded together and placing a cement composition across the edges of the substrate (seam bonding) or placing the cement composition on the surface of the second substrate 16 and forcing the substrates together (compression bonding). The cement composition forming the bond is mechanically nonstructural in nature and only moderately stressed. Its purpose is to hold the ferrimagnetic single crystal layer at a close uniform spacing to the permalloy propagation structure, and the transfer (write-read) components of the circuit. For practical devices used in bubble memory systems it is desirable that the adhesive is rapidly setting, has a softening temperature in excess of 100° C, can be applied in thin (a few thousand Angstroms thick) layers uniformly over the bonding surface, is inert to ambient deterioration and that the resulting bond is durable up to temperatures of 70° C (this is 35° C in excess of the memory module operating temperature). Among the bond agents which met these requirements are Canada balsam, apiegon wax in trichloroethylene, silicon rubber (RTV 3140), 2-cyanoacrylate, cellulose nitrate, epoxy, phenolic polyvinyl butyral and cellulose caprylate. For experimental devices it is also necessary that the cement composition is optically transparent for observation and measurement of bubble propagation and other device functions such as loop to loop transfer, domain stretching and bubble nucleation. The property of nondestructive dissolution of the bond and subsequent reuse, particularly of large crystals, adds to the usefulness of the method in providing higher yields compared to the method of deposition of the bubble circuit on the garnet crystal. Preferably, the cement composition is optical grade Canada balsam since it is especially suitable for meeting these requirements. As is well known, Canada balsam is the oleoresin yielded by the balsam fir, the oleoresin being characterized as a yellowish, viscid liquid solidifying to a transparent mass.

There are several techniques for preparing the cement composition and for bonding the substrates together; the preparation will be discussed subsequently. In all methods, the cement composition is placed on a bonding surface. The bonding surface may be the entire surface, including the spaced points, of the second substrate 16 or it may be the edges of the substrates, including the inner peripheral surfaces of the substrates 12 and 16. If the former, the cement composition is placed on the surface of the substrate 16, and then the substrates are forced together; if the latter, the substrates are first held together in a properly aligned orientation, and then the cement composition is placed along the edges of the substrates.

The following methods of preparing the cement composition apply to either the compression or seam bonding methods. In one preferred method, a quantity of a solid cement composition is placed on the bonding surface, and the composition and the bonding surface are heated until the composition becomes liquified. The substrate 12 is also heated to the same temperature. After the substrates are placed together, the composition is then allowed to cool to complete the bond. It is understood of course that in the seam bonding mode, the substrates are already placed together. Preferably, the solid cement composition is finely ground, purified Canada balsam powder heated to a temperature ranging from 110° C to 140° C.

Another method includes dissolving a solid cement composition in an effective amount of a solvent to form a homogenous solution and dispensing a quantity of the solution onto a bonding surface. The bonding solution is dispensed from a microliter pipette. A small droplet is expelled through a capillary opening positioned in proximity of the bonding surface. Where the bonding surface is the surface of the pattern of elements on the substrate 16, the crystal 14 is aligned above the substrate 16 and placed to rest on the built-in spacers shown in FIG. 1 and bonded to the substrate 12 under pressure. A criterion has been established which measures the dispensing volume for a practical range of crystal area (3.6 × $10^{-3}$ to 2.5 × $10^{-1}$ inch$^2$) and for low viscosity adhesives such as Canada balsam in toluene. Adhesive dispensing is adjusted to give droplet diameter on a test plate which is 0.50 the diameter of the crystal to be bonded. Typical dispensed volumes in which the cement composition is dispensed on the circuit substrate are:

| Circuit Capacity in kbit | Crystal Area in cm² | Adhesive Volume in cm³ |
|---|---|---|
| 1 | .023 | $2.3 \times 10^{-6}$ |
| 4 | .079 | $7.9 \times 10^{-6}$ |
| 65 | .58 | $5.8 \times 10^{-5}$ |

The following is an example of the preparation of a preferred cement composition solution. 0.73 gm of optical grade purified Canada balsam is dissolved in 1.0 ml of trichloroethylene. The dispensing capillary opening has a diameter of 0.0045 inch.

The crystal loading is adjusted to produce a bonding pressure in the range from $8.6 \times 10^2$ gm/cm² to $5.0 \times 10^4$ gm/cm². This typical pressure range is sufficient to squeeze the adhesive out to contact the spacers with the crystal and form a bonding layer of less than 1 μl in thickness. Typical "Microliter Pipettes" used are the Unimetrics 1 μl and 10 μl pipettes available from Arthur H. Thomas Co., Philadelphia, Pa. catalog No. 7684-H20 and 7684-H30. The 1μl pipette is sensitive enough to dispense the smallest volumes required for bonding of these devices, with a smallest calibrated division of $1 \times 10^{-5}$ cm³. The inside diameter of the dispensing capillary is 0.0045 inch.

The following comprise points directed specifically to this solution bonding method for seam bonding. The cleaned substrate 16 and crystal 14 are placed in contact under observation in a microscope at a magnification where the whole crystal can be observed. (Typically 50 X Magnification). Wedge interference fringes are observed in the airgap between circuit and crystal. Pressure is applied to the crystal to affect its contact with the spacers. When contact is achieved, a uniformly colored single fringe is observed. The device is then placed into a bonding apparatus and pressure is applied. The edges of the crystal are then bonded to the substrate with a cement, such as a solution of canada balsam in a solvent. After drying, the device is removed from the bonder.

A slight amount of the Canada balsam is filling the space between the crystal and the glass substrate at the edge of the crystal and a small wedge is formed. This wedge has the same index of refraction as the glass and therefore forms a complimentary air wedge between crystal and substrate. At high magnification (> 800 X) one observes transmitted light interference fringes which are a direct measure of the spacing. The resolution of this measurement is within 2700A. when green monochromatic light is used. For example, in a device bonded by this method we observed three interference fringes at the balsam - air interface under the crystal. With a wavelength of 6000A. for white light used the spacing is 9000A. From separate measurements of the spacerheight of 8500A. we conclude that the crystal is within 500A. from the pedestal in the area measured.

In the third method, a droplet of bonding solution is dispensed onto the bonding surface, e.g., the circuit substrate 16. The substrate is heated to the temperature range from 110° C to 140° C until the solvent is driven off and the cement is liquid. The preheated crystal is compression bonded, cooled and removed from the bonding apparatus. This method is equally applicable to seam bonding.

While in the preceeding examples, the bonding solution was Canada balsam in trichloroethylene, it is to be understood that other solvents, such as toluene and xylene, may be used with either balsam or the other previously mentioned adhesives. One skilled in the art shall be able to combine any of these adhesives with any of these solvents in effective amounts to produce the desired solution. For additional assistance, reference may be made to the textbook entitled "Handbook of Adhesives" by Irving Skeist, published in 1962 by Reinhold Publishing Corporation.

The following describes a suitable bonding apparatus for fabricating the device. The substrate 16 is placed on a support member which is optically transparent in the region where the substrate is located; preferably the support member is glass and has a hot plate associated therewith for heating the glass support member and thus the substrate 16. An upper member is on top of the substrate 12 after the substrate is in contact with the substrate 16. The upper member is also transparent and preferably is made of glass or quartz. The two members are held parallel to each other with the device sandwiched therebetween under pressure. At one end of both members, a suitable fastener assembly is provided which holds those ends of the two members fixed in a parallel relationship. The other end of the upper member has a suitable weight located thereon; this weight creates adequate pressure on the substrates to force them together in the compression bonding mode or to hold them together in the seam bonding mode. The advantage of this apparatus is the ability to provide uniform pressure to the surface of the substrates. The upper member may also have apertures formed therein to permit insertion of the cement composition during seam bonding. Light may be directed through the device and the support and upper members. A microscope may be located above the upper member so that the bonding step may be closely observed.

The embodiments of the present invention are merely exemplary and those skilled in the art will be able to make numerous variations and modifications of them without departing from the spirit of the invention. All such variations and modifications are intended to be included within the scope of the present invention as defined in the appended claims.

We claim:

1. A bubble memory device of the type adapted to operate at a rate in excess of 50K bits per second comprising:
   a. a first substrate made of a single crystal, nonmagnetic material and having a planar surface thereon,
   b. a thin film, single crystal layer of a magnetic material on the planar surface of the first substrate,
   c. a second substrate made of a non-conductive and non-magnetic material and having a planar surface thereon,
   d. a desired pattern of thin film magnetic elements and conductive elements on the planar surface of the second substrate, the pattern having a plurality of at least three, spaced, non-colinear points, the heights of which measured from the planar surface of the second substrate are equal, predetermined and greater than the heights of the other portions of the elements, the layer on the first substrate being adjacent to and in contact with the spaced points so that a controlled spacing is maintained over the entire juxtaposed substrates of the resulting bubble memory device, and
   e. a quantity of Canada balsam cement composition disposed around the peripheral portions of the substrates and partially within the space between the substrates for securing the substrates in the juxtaposed orientation, the variation in spacing between the first and second substrates being no greater than 500 A.

2. A method of producing a bubble memory device of the type adapted to operate at a rate in excess of 50K bits per second comprising the steps of:
  a. forming a first substrate made of a single crystal, non-magnetic material and having a planar surface thereon,
  b. forming a thin film, single crystal layer of a magnetic material on the planar surface of the first substrate,
  c. forming a second substrate made of a non-conductive and non-magnetic material and having a planar surface thereon,
  d. employing a desired pattern of thin film magnetic elements and conductive elements on the planar surface of the second substrate, the pattern having thereon a plurality of at least three spaced, non-colinear points, the heights of which are equal, predetermined and greater than the heights of the other portions of the elements, the layer on the first substrate being adjacent to and in contact with the spaced points so that a controlled spacing is maintained over the entire juxtaposed substrates of the resulting bubble memory, and
  e. bonding the layer on the first substrate against the spaced points on the second substrate so that a controlled spacing is maintained over the entire juxtaposed surface of the resulting bubble memory device, the bonding step including holding the substrates in a properly aligned, juxtaposed orientation such that the layer is in contact with the spaced points and placing an amount of a cement composition along a portion of the periphery of the substrates and partially within the space between the substrates to form a bond between the substrates.

* * * * *